United States Patent
Ando et al.

(10) Patent No.: US 6,184,946 B1
(45) Date of Patent: Feb. 6, 2001

(54) ACTIVE MATRIX LIQUID CRYSTAL DISPLAY

(75) Inventors: Masahiko Ando, Hitachinaka; Masatoshi Wakagi, Hitachi; Ritsuo Fukaya, Hitachinaka, all of (JP)

(73) Assignee: Hitachi, Ltd., Tokyo (JP)

( * ) Notice: Under 35 U.S.C. 154(b), the term of this patent shall be extended for 0 days.

(21) Appl. No.: 09/308,925
(22) PCT Filed: Nov. 27, 1996
(86) PCT No.: PCT/JP96/03467
§ 371 Date: May 27, 1999
§ 102(e) Date: May 27, 1999
(87) PCT Pub. No.: WO98/23995
PCT Pub. Date: Jun. 4, 1998
(51) Int. Cl.[7] .................................................. G02F 1/136
(52) U.S. Cl. .............................. 349/42; 349/43; 349/141; 349/143
(58) Field of Search .............................. 349/42, 43, 141, 349/143

(56) References Cited

FOREIGN PATENT DOCUMENTS

| 2-164075 | * | 12/1988 | (JP) . |
| 4-334063 | * | 11/1992 | (JP) . |
| 8-62578 | * | 8/1994 | (JP) . |
| 07036058 | * | 2/1995 | (JP) . |

* cited by examiner

*Primary Examiner*—James A. Dudek
(74) *Attorney, Agent, or Firm*—Antonelli, Terry, Stout & Kraus, LLP

(57) ABSTRACT

A thin film transistor used as a switching element of an active matrix type liquid crystal display is an enhancement-mode thin film transistor including a silicon nitride film formed over a scanning electrode, an insulating layer formed on the silicon nitride film, and a semiconductor layer having a source region and a drain region formed on the insulating layer. The thin film transistor has a threshold voltage higher than the maximum value of the liquid crystal operating voltage. The insulating layer is a silicon oxide film having a thickness of 30 Å or more.

18 Claims, 5 Drawing Sheets

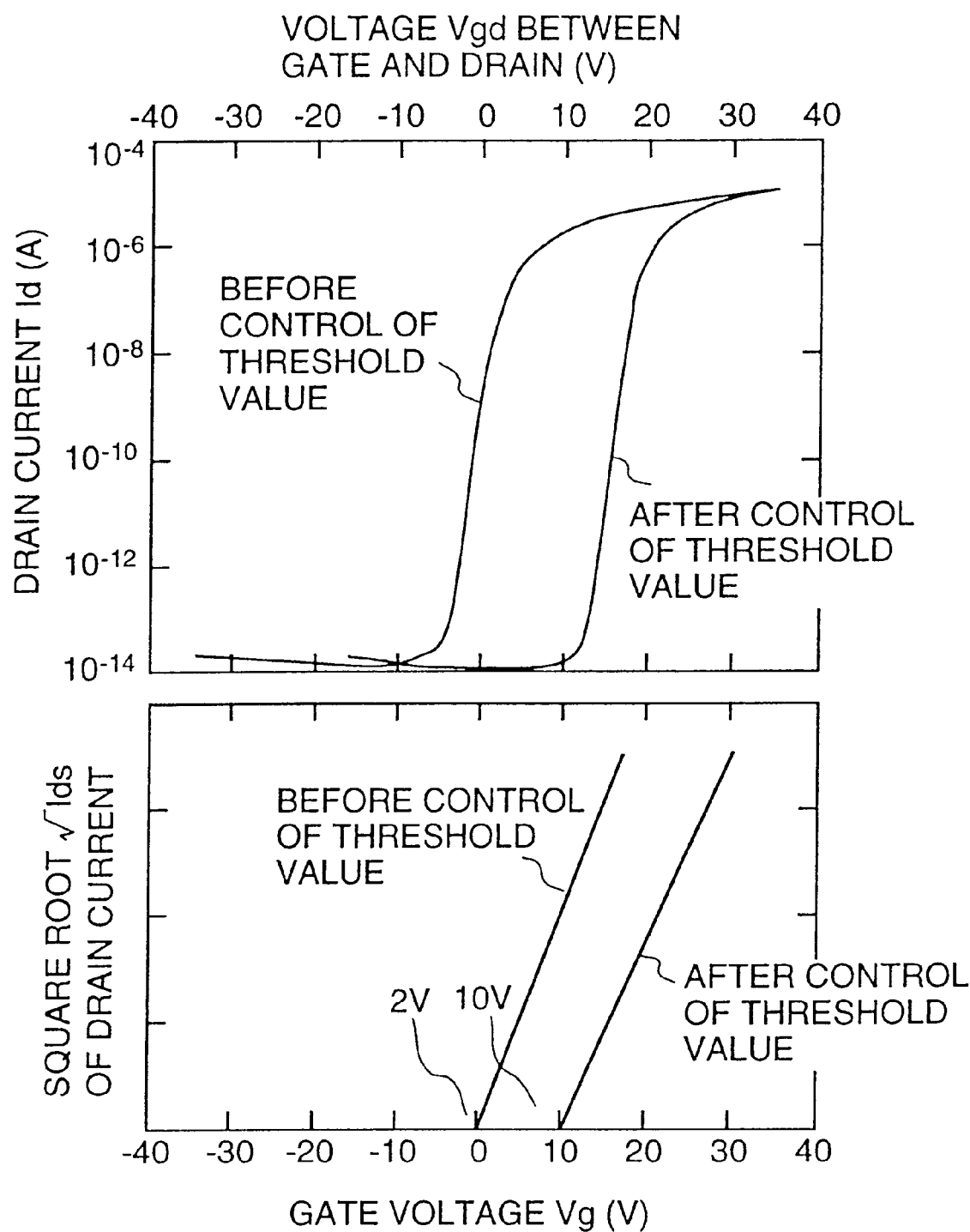

FIG. 4
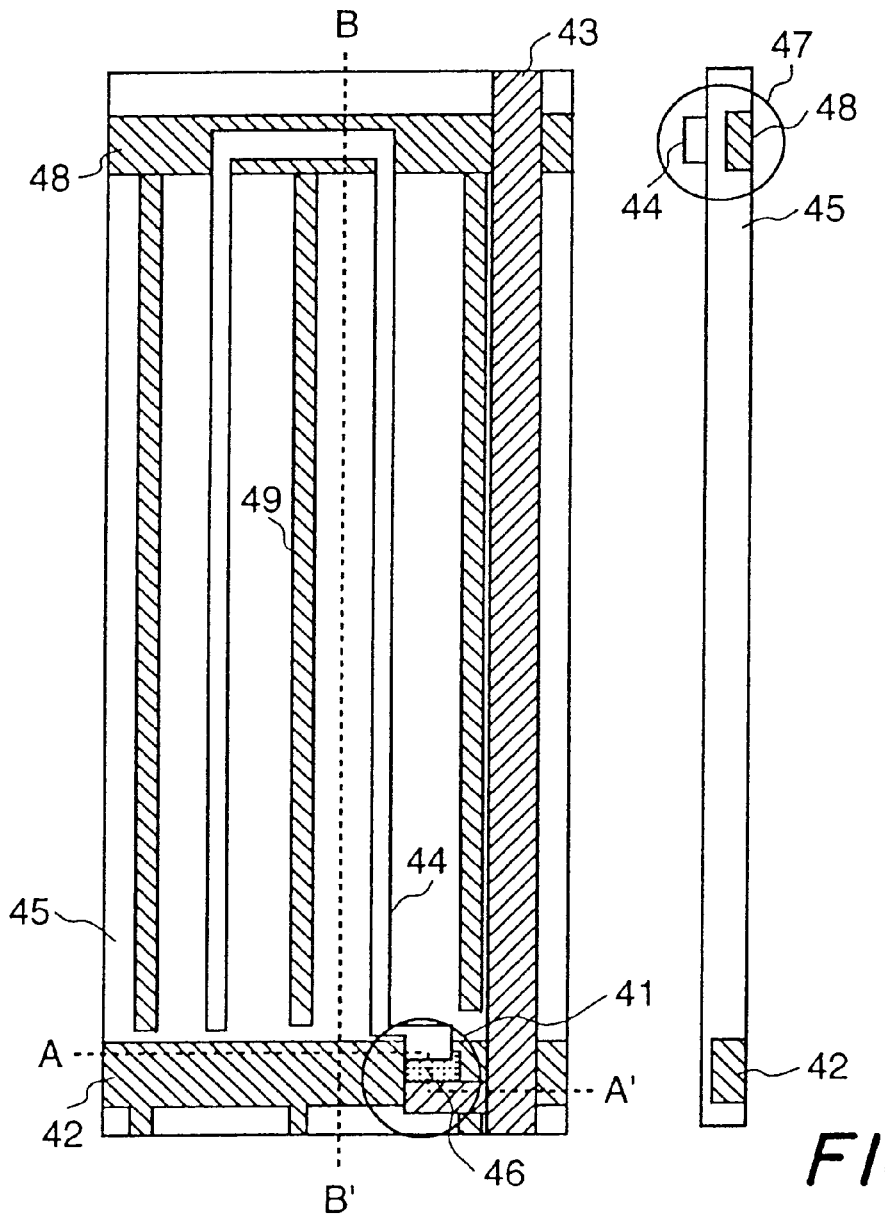
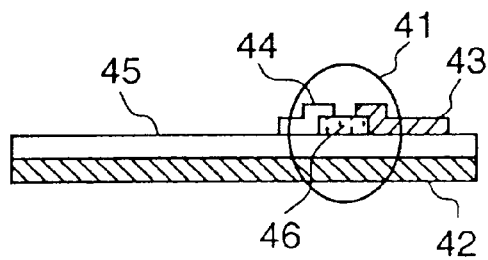
FIG. 4A
FIG. 4B

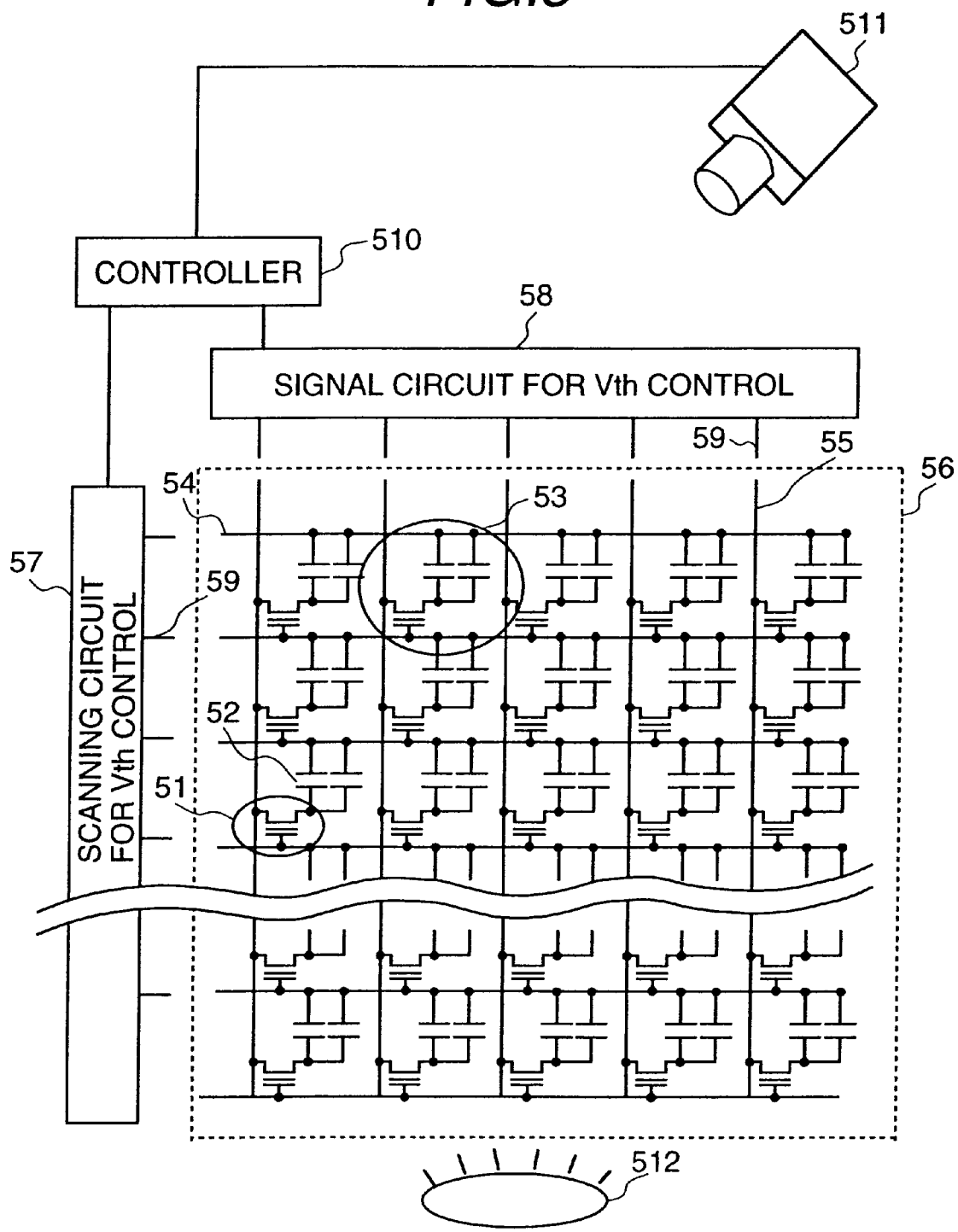

ACTIVE MATRIX LIQUID CRYSTAL DISPLAY

TECHNICAL FIELD

The present invention relates to an active matrix type liquid crystal display which has a wide range of viewing angles, and that the power consumption is low.

BACKGROUND ART

An active matrix type liquid crystal display using switching elements such as thin film transistors (TFTS) begins to spread widely as a display terminal of an office automation apparatus, etc. The display type of such a liquid crystal display is roughly divided into the following two kinds. One is a method in which the liquid crystal is sandwiched by two substrates on which transparent electrodes are formed, and it is operated by applying a voltage to the transparent electrodes, and the display is performed by modulating the light penetrated the transparent electrodes and launched into the liquid crystal. The other is a method in which the liquid crystal is sandwiched by two substrates on which transparent electrodes are formed, and it is operated by applying an electric field substantially parallel to one substrate and between two electrodes (a pixel electrode and an opposed electrode) formed on the substrate, and the display is performed by modulating the light incident from the space of one electrode into the liquid crystal. Because this method has features such as a wide range of viewing angles and low load capacitance, etc, it is a promising technology concerning the active matrix type liquid crystal display. Hereinafter, the latter method is called a horizontal electric field method.

While the horizontal electric field method has the above-mentioned features, there is a problem that it is necessary to use a bright back light of which electric power consumption is large, because opaque electrodes are formed like comb teeth. It is because the frontage area through which light can be penetrated is small and thus display screen is dark.

On the other hand, the same applicant has proposed one method in the Japanese Patent Application No. 6-199247, in which the role of the common electrode wiring of supplying an external voltage to the common electrode is given to the scanning electrode wiring, the common electrode wiring is eliminated, and thus the frontage area in the horizontal electric field method is enlarged. Hereinafter, the above-mentioned method technology will be called horizontal electric field method having no common-electrode-wiring (common-less horizontal electric field method).

In the common-less horizontal electric field method, it is required that the thin film transistor or the switching element indicates fully the enhancement type switching characteristic that the threshold voltage is higher than the maximum voltage of the liquid crystal operating voltage required to modulate optically the liquid crystal. As a method of making the thin film transistor which shows the enhancement type switching characteristic, a method of making a thin film of the amorphous silicon semiconductor layer or a method of tLr controlling the voltage of the back electrode provided at a position opposed to the gate scanning electrode of the thin film transistor has been described in the above Japanese Patent Application No. 6-199247.

However, in these methods, it is necessary to reduce enough the difference of threshold voltages of the THIN FILM TRANSISTOR. There is a problem that the display quality of the active matrix type liquid crystal display having no common-electrode-wiring is low.

An object of the present invention is to provide an active matrix type liquid crystal display having no opposed-electrode-wiring of the horizontal electric field method, in which the difference of threshold voltages are reduced, thin film transistors with simple structure are used, and the picture resolution is improved.

DISCLOSURE OF INVENTION

The thin film transistors used as the switching elements of the active matrix type liquid crystal display of the present invention is of an enhancement type, and has a silicon nitride formed on a scanning electrode, an insulating layer formed on the silicon nitride film, and a semiconductor layer having a source area and a drain area each formed on the insulating layer.

The threshold voltage of this thin film transistor is larger than the maximum value of the liquid crystal operating voltage. In a preferred embodiment, the threshold voltage is 10V or more.

As the concrete example of the insulating layer formed on the silicon nitride film, there is an silicon oxide film, and as for the thickness of the insulating layer, 30 Å or more is desirable.

A semiconductor layer where a source electrode and a drain electrode were connected through the electric contact layer is formed on the insulating layer.

In the present invention, the horizontal electric field method is adopted, and an electric field parallel to the substrate is generated in the liquid crystal layer by the voltage applied to an opposed electrode corresponding to a pixel electrode.

The transistor structure used in the present invention is a thin film memory transistor structure which is called MNOS (Metal Nitride Oxide Semiconductor) structure.

In the present invention, the threshold voltage of the thin film transistor is controlled as follows. A positive threshold control voltage very higher than the liquid crystal operating voltage (before and behind ±10V), is applied to the gate electrode, with the drain electrode, or the drain electrode and the source electrode grounded. Further, when the thin film transistor of the present invention is arranged like a matrix at the intersection of the scanning (gate) electrode wiring and signal (drain) electrode wiring in the active matrix type liquid crystal display, the above-mentioned threshold control voltage is individually applied between the gate/drain electrodes of each thin film transistor, for example, by using the line-sequential drive method so that the threshold voltage of each thin film transistor may become equal. In this case, the homogeneity of the display quality is secured by controlling while monitoring the brightness distribution of the liquid crystal display in order to decrease the differences of threshold voltages.

When the threshold control voltage is applied as mentioned above, the electrons in the semiconductor layer pierces through the silicon oxide film and are trapped in the silicon nitride film because the gate electrode becomes a positive voltage with respect to the drain electrode. The threshold voltage of the thin film transistor shifts to the plus side by the action of the electrons trapped in the silicon nitride film. Therefore, the thin film transistor comes to show the characteristic of the enhancement type. An amount of the electrons trapped in the silicon nitride film increases if the threshold control voltage is increased, and threshold voltage increases. Therefore, the threshold voltage of each thin film transistor can be shifted to the same value by individually adjusting the threshold control voltage applied to each thin film transistor. As a result, the differences of threshold voltages can be greatly decreased.

Further, since the silicon oxide film thickness is 30A in the embodiment of the thin film transistor of the present invention, the threshold value is not changed during the operation of display when using the thin film transistor for a horizontal electric field type switching element having no common-electrode-wiring. Therefore, the characteristic of the stable enhancement type can be provided. This operation will be explained in detail hereinafter.

In general, the electrons in the silicon nitride film pierced through the silicon oxide film is discharged in the semiconductor layer, or the positive hole in the semiconductor layer pierced through the silicon oxide film is trapped in the silicon nitride film when the voltage reversed in its polarity to the above-mentioned is applied between the gate/drain electrodes of the thin film transistor of the MNOS structure so that the gate electrode may become negative. Therefore, the threshold voltage is shifted to a minus side. The voltage with both polarities and approximately with the magnitude of the crystal liquid operating voltage (before and behind ±10V) level is applied between the gate/drain electrodes during the operation of display when the thin film transistor of the present invention is used as a horizontal electric field type switching element having no common-electrode-wiring. In this case, it is required that the threshold voltage of the thin film transistor does not change according to the voltage applied.

The dependence of the absolute value (hereinafter, called athreshold-shift-start voltage) of the minimum voltage applied between the gate/drain electrodes where the threshold voltage is shifted on the thickness of the silicon oxide film, is shown in FIG. 7. While the threshold-shift-start voltage is about 5V when the silicon oxide film thickness is 20 Å or less, When the silicon oxide film thickness is 30 Å or less, the threshold-shift-start voltage becomes more than the maximum value of the liquid crystal operating voltage.

The reason is as follows. the electrons or the positive holes pass through the thin silicon oxide film according to the tunnel effect by applying the voltage of about 5V, when the silicon oxide film thickness is 20 Å or less. However, the electrons or the positive holes should exceed the energy barrier of the silicon oxide film when the silicon oxide film thickness is 30 Å or more. As a result, a higher electric field is needed.

According to the thin film transistor of the present invention, the threshold voltage once shifted to the plus side is not changed and is maintained constant during the operation of display. Therefore, the active matrix type liquid crystal display having no common-electrode-wiring of the horizontal electric field method can provide the stable characteristic of the enhancement type.

Further, it becomes possible to even up the threshold voltage by controlling the threshold voltage while monitoring the brightness of display in the active matrix type display of the present invention. By applying a further threshold control voltage to the part where the brightness of display is lower in the normally black display, an active matrix type display with a high resolution and having a uniform threshold characteristic can be provided.

BRIEF DESCRIPTION OF DRAWINGS

FIG. 2 a view showing the Id-Vg characteristic of the thin film transistor used in the present invention.

FIG. 4 is a view showing the plane structure and the section structure of the pixel part of the liquid crystal display of the,present invention.

FIG. 5 is a view showing the composition of a control unit for the threshold voltage of the thin film transistor used in the present invention.

BEST MODE FOR CARRYING OUT THE INVENTION

Figure 1:
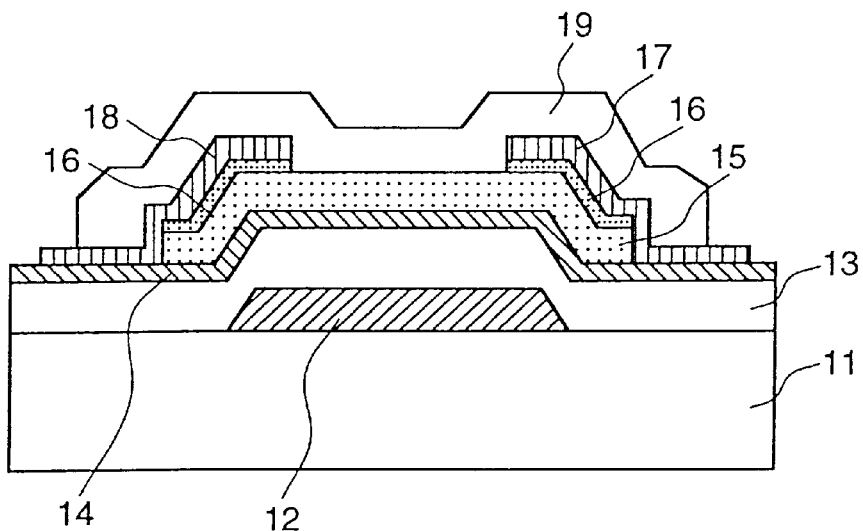
FIG. 1 is a view showing the section structure of the thin film transistor used in the present invention.

Hereinafter, Embodiments of the present invention will be explained with reference to the drawings. The section structure of the thin film transistor used in the present invention is shown in FIG .1. 11 designates a glass substrate, 12 a gate electrode formed of Al or Cr, 13 a first gate insulating layer formed of a silicon nitride film, 14 a second gate insulating layer formed of the silicon oxide film, 15 a semiconductor layer formed of amorphous silicon, 16 an electric contact layer formed of amorphous silicon into which n+type amorphous silicon is doped, 17, 18 designate a source electrode and a drain electrode each formed Cr, respectively, and 19 designates passivation film formed of the silicon nitride film.

The thin film transistor having the above-mentioned structure was made as follows. First of all, the Al film or the Cr film of about 300 nm thick is formed on the Corning 7059 glass substrate 11 by using the sputtering technique. Al is patterning-processed by using the photo etching, and thus the gate electrode 12 is formed.

Further, the first gate insulating layer 13 formed of the silicon nitride film of 2500 Å thick is formed by using the plasma chemical vapor deposition (CVD) method in which the gas mixed such as $SiH_4$, $NH_3$, and $N_2$ is used. Furthermore, the second gate insulating layer 14 formed of the silicon oxide film of 100 Å thick is formed by using the plasma CVD method in which the gas mixed such as TEOS (tetraethylorthosilicate) and $O_2$ is used. Furthermore, an amorphous silicon film of 2000 Å thick is formed by using the plasma CVD method in which the $SiH_4$ gas is used, and an n+type amorphous silicon film of 300 Å thick is formed by using the plasma CVD method in which the gas mixed $SiH_4$ and $PH_3$ is used.

It is preferable to carry out continuously the thin film forming process by the above-mentioned plasma CVD method. The amorphous silicon film is processed like an island at the same time as the n+type amorphous silicon film, by using photo etching. As a result, a semiconductor layer 15 is formed. Further, Cr deposited by using the sputtering technique is patterning-processed by the photo etching. As a result, the source electrode 17 and the drain electrode 18 are formed.

Further, the electric contact layer 16 is formed between the source electrode 17 and the drain electrode 18, and the semiconductor layer 15 by removing n+type amorphous silicon film between the source/drain electrodes using etching technique. Furthermore, a protective insulation film 19 is formed by patterning by using the photo etching the silicon nitride film of 5000 Å thick piled up by the plasma CVD method. As a result, the thin film transistor is completed.

The threshold voltage of the thin film transistor manufactured in the above-mentioned method was controlled as follows. That is, a positive voltage of +80 V was applied to the gate electrode for two seconds with the drain electrode, or the drain and the source electrodes grounded.

The dependence (Id-Vg characteristic) of the drain current before and after the control of the threshold voltage on the gate voltage in the thin film transistor of the present invention is shown in FIG. 2. The threshold voltage is increased from 2V to 10V due to the voltage applied in the above-mentioned way, and the thin film transistor comes to show the characteristic of the enhancement type.

Next, the change with the lapse of time of the threshold voltage of the thin film transistor in which the threshold voltage had been shifted in the above-mentioned way was examined. The threshold voltage was measured at regular intervals by applying rectangular AC voltages of ±15V and ±10V to the gate electrode and the drain electrode respectively in order to simulate the state when the thin film transistor of the present invention is used for the switching elements of the active matrix type liquid crystal display of the horizontal electric field method.

Figure 3:
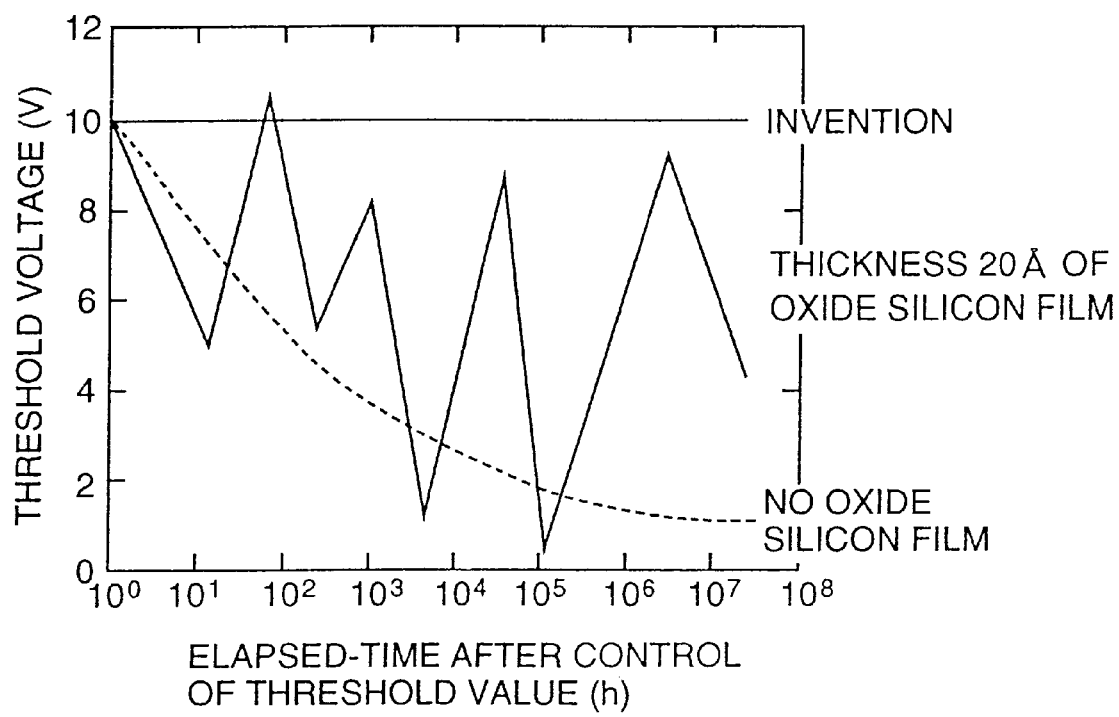
FIG. 3 is a view showing the change with the lapse of time of the threshold voltage of the thin film transistor used in the present invention.

The change with the lapse of time of the threshold voltage measured in the above-mentioned way is shown in FIG. 3. The results of the conventional thin film transistor having no silicon oxide film and the thin film memory transistor having the silicon oxide film of 20 Å thick are also shown for comparison. While the threshold voltage is not changed for 10⁴ hours or more in the thin film transistor of the present invention, the threshold voltage is decreased monotonously in a short time in the thin film transistor where there is no silicon oxide film. Further, the threshold voltage is changed greatly due to the voltage applied.

In this embodiment, the semiconductor layer 15 of the amorphous silicon is formed continuously on the second gate insulating layer 14 of the silicon oxide film. However, if the semiconductor layer 15 is formed after the surface of the second gate insulating layer 14 of the silicon oxide film is exposed to the N2 plasma during a predetermined time, the leading edge of the drain current due to an increase of the gate voltage more than threshold voltage becomes steep in the dependency of the drain current on the gate voltage shown in FIG. 2. As a result, the switching characteristic of the thin film transistor has been improved.

While the thin film transistor having the reverse stagger structure is used in the present invention, the positive stagger structure or the co-planar structure may be also used. Further, it may use poly-silicon or fine crystal silicon other than the amorphous silicon for the semiconductor layer. The plane structure and the section structure of the pixel part in the substrate of the thin film transistor of the horizontal electric field type liquid crystal display having no common-electrode-wiring according to the present invention are shown in FIG. 4, in which the thin film transistor is used as switching element. In FIG. 4, one pixel comprises the area surrounded by the scanning electrode and the signal electrode adjacent to each other. A thin film transistor 41 comprises a scanning electrode (a gate electrode) 42, a signal electrode (a drain electrode) 43, a pixel electrode (a source electrode) 44, a gate insulating layer 45 formed by the accumulation film of the silicon oxide film and the silicon nitride film, and a semiconductor layer 46 of the amorphous silicon.

The scanning electrode 42 was formed in the lowest layer, and the signal electrode 43 and the pixel electrode 44 were formed by pattern-processing the same metallic layer through the gate insulating layer 45 and the semiconductor layer 46. A storing capacitance 47 was formed as a structure in which the gate insulating layer 45 of the silicon oxide film and the silicon nitride film is sandwiched between the pixel electrode 44 and the scanning electrode 48.

The direction of the orientation of the liquid crystal layer is controlled by the electric field applied between the opposed electrode 49 which extends in a direction from the scanning electrode 48 to the signal electrode and the pixel electrode 44 which extend in parallel between the opposed electrodes 49. The light passed between the opposed electrode 49 and the pixel electrode 44 is launched into the liquid crystal layer and modulated therein. In a horizontal electric field type liquid crystal display having no common-electrode-wiring, there is no common electrode wiring because the scanning electrode 48 plays the role of the common electrode wiring concurrently.

FIG. 5 shows the composition of a horizontal electric field type liquid crystal display panel having no opposed-electrode-wiring and a threshold voltage control unit of the TFT in the display panel, in which the thin film transistor is used as a switching element.

In the figure, 51 designates the thin film transistor of the present invention, 52 a liquid crystal and a storing capacitance, 53 a pixel, 54 a gate electrode wiring, 55 a drain electrode wiring, 56 a liquid crystal display panel, 57 a scanning circuit for threshold value control (hereinafter, called a scanning circuit), 58 a signal circuit for threshold value control (hereinafter, called a signal circuit), 59 a probe needle, 510 a controller, 511 a two dimensional light sensor, and 512 back light.

The threshold voltage of the thin film transistor of the liquid crystal display panel is controlled as follows by the use of the threshold voltage control unit of the present invention. Where, assumed that the threshold voltage of the thin film transistor becomes +10V when the voltage of +80V is applied for two seconds. A scanning circuit 57 and a signal circuit 58 are connected through a probe needle 59 to the gate electrode wiring 54 and the drain electrode wiring 55 of the liquid crystal display panel 56 arranged on the back light 512.

The threshold control voltage is individually applied to each of the thin film transistor 51 of the present invention located at the intersection of the gate electrode wiring 54 and the drain electrode wiring 55 by using the so-called line-sequential drive method. That is, the gate voltage with the amplitude +20V is applied in order from the scanning circuit 57 to each of the gate electrode wiring 54 for two seconds to each. The drain voltage of −60V is applied from a signal circuit 58 to each of the drain electrode wiring 55 for two seconds during the period of the appliance of the gate voltage (called the selection period).

With respect to each of the thin film transistor 51 located at the intersection of the gate electrode wiring 54 and the drain electrode wiring 55, the threshold control voltage of +80V is applied between the gate/drain electrodes for two seconds in a direction where the gate voltage becomes positive.

After applying the threshold control voltage to each thin film transistor 51 in the above-mentioned method, the threshold voltage of each thin film transistor 51 is evaluated by measuring the brightness of the pixel 53 where each thin film transistor is located. That is, liquid crystal display panel 56 is lighted completely in the line-sequential drive method by using the gate voltage with the amplitude ±10V and 0V output from the scanning circuit 57 during the selection period and the non-selection period and the liquid crystal operating voltage with the amplitude +10V output from the signal circuit 58 (the display mode of the liquid crystal panel is the normally black mode in which the display is performed during the period that the voltage is not applied).

The brightness of each of the pixels of the liquid crystal display panel 56 is recorded by two dimensional photo sensor 511, and is fed back to the controller 510. Compared with the pixel where the thin film transistor having the threshold voltage of +10V is located, the brightness of the thin film transistor of which the threshold voltage is +10V or less because of the insufficient shift of the threshold voltage is deteriorated. This is because the pixel at the position can not maintain the liquid crystal operating voltage of −10V during the non-selection period as described in the Japanese Patent Application No. 6-199247.

Therefore, the position where the thin film transistor of which the increase in the threshold voltage is insufficient is detected by two dimensional photo sensor 511 as the position of the pixel of low brightness. The controller 510 controls the output voltage from the scanning circuit 57 and the signal circuit 58 so that the threshold control voltage can be applied again only to the thin film transistor of which the increase in the threshold voltage is insufficient according to the distribution of the brightness of each pixel obtained from the two dimensional photo sensor 511. In this case, the threshold control voltage applied to each thin film transistor can be controlled by increasing or decreasing the drain voltage. The brightness of each pixel of the liquid crystal display panel 56 is recorded again with two dimensional photo sensor 511 after the threshold control voltage is applied again, and the above-mentioned operation is repeated until the brightness of each pixel becomes uniform.

By detecting an amount of the shift of the threshold voltage of each thin film transistor as two dimensional distribution of the brightness of the pixel of the liquid crystal display, and by applying individually the threshold control voltage to each thin film transistor according to the detected amount of the shift of the threshold voltage, it is possible to control and even up the difference of the threshold voltages of the thin film transistor 51 used in a horizontal electric field type liquid crystal display panel 56 having no opposed electrode wiring.

Figure 6:
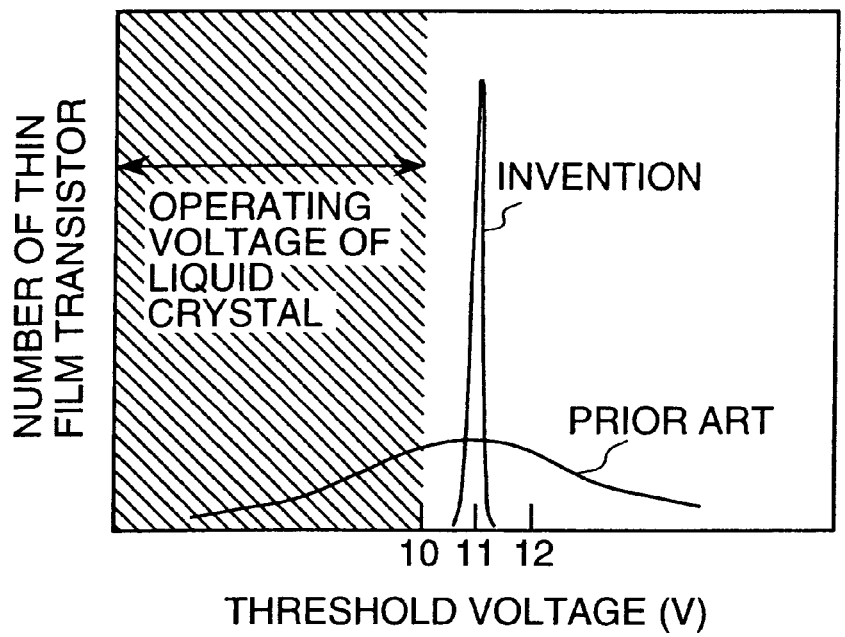
FIG. 6 is a view showing the threshold voltage distributions in the conventional thin film semiconductor transistor and the thin film semiconductor transistor of the present invention.
Figure 7:
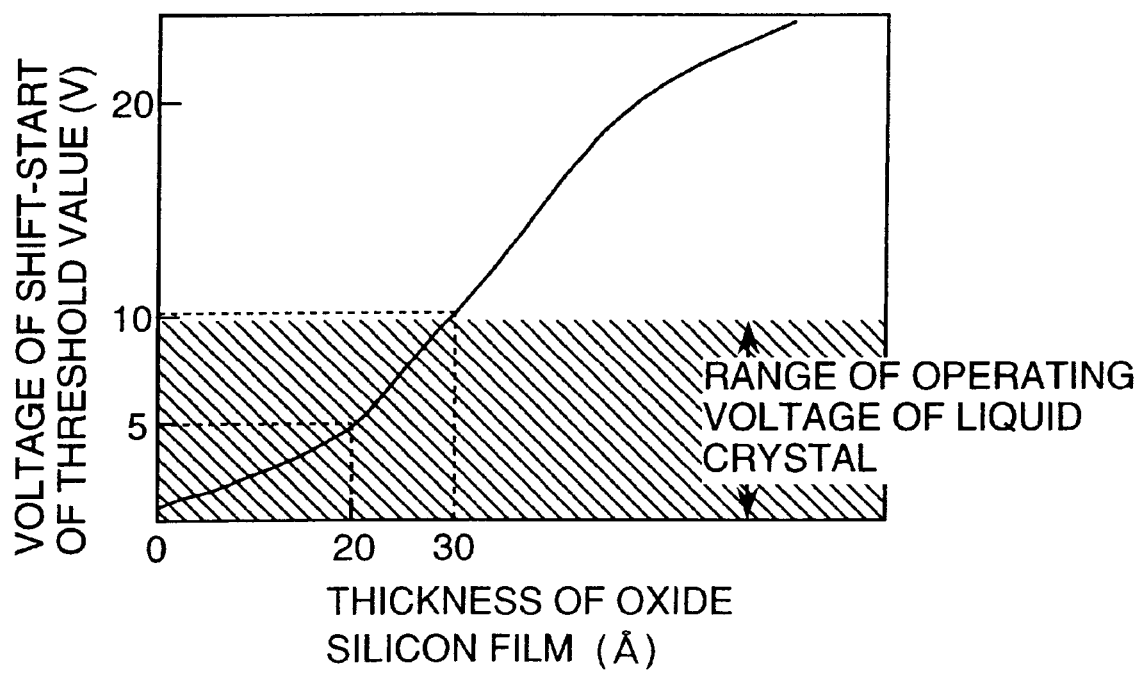
FIG. 7 is a view showing the dependence of the threshold-shift-start voltage of the thin film semiconductor transistor on the thickness of the silicon oxide film.

FIG. 6 shows the distribution of the threshold voltage of the thin film transistor in a horizontal electric field type liquid crystal display panel having no opposed electrode wiring compared with the prior art. Where, the threshold voltage is controlled by the above-mentioned threshold voltage control unit. The distribution of the threshold voltage becomes large when the threshold voltage is controlled by the prior art such as the thin-film-making of a semiconductor layer. As a result, there is a TFT of which the threshold voltage becomes below the liquid crystal operating voltage.

As described above, the uniform of the display can not be obtained, because the decrease in the brightness is occurred at the pixel where the thin film transistor of which the threshold voltage is less than the liquid crystal operating voltage is located. While, in the present invention, the threshold voltages of all thin film transistors are more than liquid crystal operating voltage, and the distribution of the threshold voltage is less than ±1V. Therefore, the liquid crystal operating voltage applied to each pixel becomes uniform and the display quality is improved, because the uniform switching operation is performed during the operation of display in a horizontal electric field type liquid crystal display panel having no opposed-electrode-wiring which uses a TFT of which the threshold value is controlled by the threshold value control unit of the present invention as a switching element.

The switching operation and thus the display brightness becomes not uniform when the distribution of the threshold voltage becomes ±1V or more because of the insufficient control of the threshold value.

It should be appreciated that it is not necessary to provide the threshold voltage control unit of the present invention if the shift of the threshold value of the thin film transistor is uniform from the beginning. In such a case, the same threshold control voltage may be applied to all thin film transistors at the same time.

What is claimed is:

1. An active matrix type liquid crystal display having a pair of substrates and a liquid crystal layer sandwiched by the substrates, wherein a plurality of scanning electrodes, a plurality of signal electrodes which intersect with said scanning electrodes in the form of a matrix, a plurality of semiconductor switching elements corresponding to respective intersections of said scanning electrodes and said signal electrodes, a plurality of pixel electrodes each connected to a respective one of said switching elements, and a plurality of opposed electrodes each connected to one of said scanning electrodes, are formed on one of said pair of substrates, and wherein each of said plural semiconductor switching elements is a thin film transistor of an enhancement type and comprises a semiconductor layer having a silicon nitride film formed on a corresponding scanning electrode, an insulating layer formed on the silicon nitride film, and source and drain areas formed on the insulating layer.

2. An active matrix type liquid crystal display according to claim 1, wherein the threshold voltage of each thin film transistor is more than the maximum value of the liquid crystal operating voltage.

3. An active matrix type liquid crystal display according to claim 2, wherein the threshold voltage of said thin film transistor is +10V or more.

4. An active matrix type liquid crystal display according to claim 1, wherein an electric field parallel with said one substrate is generated in said liquid crystal layer in response to a voltage applied to an opposed electrode corresponding to a pixel electrode.

5. An active matrix type liquid crystal display according to claim 1, wherein the thickness of said insulating layer of said thin film transistor is 30 Å or more.

6. An active matrix type liquid crystal display according to claim 5, wherein said insulating layer of said thin film transistor consists of a silicon oxide film.

7. An active matrix type liquid crystal display according to claim 6, wherein the threshold voltage of said thin film transistor is more than the maximum value of the liquid crystal operating voltage.

8. An active matrix type liquid crystal display according to claim 1, wherein said thin film transistor has a reverse-stagger structure.

9. An active matrix type liquid crystal display according to claim 1, wherein said thin film transistor has a stagger structure.

10. An active matrix type liquid crystal display according to claim 1, wherein said thin film transistor has coplanar structure.

11. An active matrix type liquid crystal display having a pair of substrates and a liquid crystal layer sandwiched by the substrates, wherein a plurality of scanning electrodes, a plurality of signal electrodes which intersect with said scanning electrodes in the form of a matrix, and a plurality of semiconductor switching elements corresponding to respective intersections of said scanning electrodes and said signal electrodes, are formed on one of said pair of substrates, wherein at least one pixel is formed at each area founded by a scanning electrode and a signal electrode, wherein each pixel has a pixel electrode connected to a corresponding thin film transistor, and an opposed electrode formed in the same direction as the pixel electrode and connected to a corresponding one of the scanning electrodes, and wherein each of said plural thin film transistors is of an enhancement type and comprises a semiconductor layer having a silicon nitride film formed on a corresponding scanning electrode, an insulating layer formed on the silicon nitride film, and source and drain areas formed on the insulating layer.

12. An active matrix type liquid crystal display according to claim 11, wherein said pixel electrode is overlapped via an insulating layer on a corresponding one of said scanning electrodes.

13. An active matrix type liquid crystal display according to claim 11, wherein the threshold voltage of said thin film transistor is more than the maximum value of the liquid crystal operating voltage.

14. An active matrix type liquid crystal display according to claim 13, wherein the threshold voltage of said thin film transistor is +10V or more.

15. An active matrix type liquid crystal display according to claim 11, wherein an electric field parallel with said substrate is generated in said liquid crystal layer in response to a voltage applied to an opposed electrode corresponding to a pixel electrode.

16. An active matrix type liquid crystal display according to claim 11, wherein the thickness of said insulating layer of said thin film transistor is 30 Å or more.

17. An active matrix type liquid crystal display according to claim 16, wherein said insulating layer of said thin film transistor consists of a silicon oxide film.

18. An active matrix type liquid crystal display according to claim 17, wherein the threshold voltage of said thin film transistor is more than the maximum value of the liquid crystal operating voltage.

* * * * *